United States Patent
Wu et al.

(10) Patent No.: US 6,754,797 B2
(45) Date of Patent: Jun. 22, 2004

(54) ADDRESS CONVERTER APPARATUS AND METHOD TO SUPPORT VARIOUS KINDS OF MEMORY CHIPS AND APPLICATION SYSTEM THEREOF

(75) Inventors: Kun-Ho Wu, Feng-Shan (TW); Hai-Feng Chuang, Tainan (TW)

(73) Assignee: Leadtek Research Inc., Taipei Hsien (TW)

( * ) Notice: Subject to any disclaimer, the term of this patent is extended or adjusted under 35 U.S.C. 154(b) by 227 days.

(21) Appl. No.: 09/990,445

(22) Filed: Nov. 20, 2001

(65) Prior Publication Data

US 2003/0051118 A1 Mar. 13, 2003

(30) Foreign Application Priority Data

Sep. 11, 2001 (TW) .......................................... 90122429

(51) Int. Cl.[7] .............................................. G06F 12/00
(52) U.S. Cl. ...................... 711/202; 711/103; 711/154; 711/129; 711/148; 365/230.03; 365/230.06
(58) Field of Search ................................ 711/1, 5, 202, 711/100, 103, 154, 129, 148; 365/230.01, 230.03, 230.04, 230.06; 703/14, 21

(56) References Cited

U.S. PATENT DOCUMENTS

| | | | | |
|---|---|---|---|---|
| 4,763,302 A | * | 8/1988 | Yamada | 365/189.01 |
| 5,600,820 A | * | 2/1997 | Johnston | 711/171 |
| 5,737,578 A | * | 4/1998 | Hennenhoefer et al. | 711/168 |
| 5,835,969 A | * | 11/1998 | Inagaki et al. | 711/217 |
| 5,875,451 A | * | 2/1999 | Joseph | 711/105 |
| 5,918,242 A | * | 6/1999 | Sarma et al. | 711/5 |
| 6,260,127 B1 | * | 7/2001 | Olarig et al. | 711/167 |
| 6,397,317 B1 | * | 5/2002 | Kusutaki | 711/202 |
| 6,411,561 B2 | * | 6/2002 | Ayukawa et al. | 365/230.03 |
| 6,411,563 B1 | * | 6/2002 | Tsuji et al. | 365/233 |
| 6,530,007 B2 | * | 3/2003 | Olarig et al. | 711/167 |

* cited by examiner

Primary Examiner—Donald Sparks
Assistant Examiner—Brian R. Peugh
(74) Attorney, Agent, or Firm—J.C. Patents

(57) ABSTRACT

Address converter apparatus and method to support various memory chips and an application system thereof. A flexibly programmed memory addressing circuit is used as a bridge between a control chip and a memory chip. A correct addressing method is selected according to a selected configuration value, so that the application system is not only able to use the control chip to support the memory chip, but is also able to use a new type of memory chip with multiple capacities. An optimal method is selected to partition or isolate the malfunctioning portion of the partly malfunctioning memory chip for further combination or simulation.

18 Claims, 2 Drawing Sheets

ADDRESS CONVERTER APPARATUS AND METHOD TO SUPPORT VARIOUS KINDS OF MEMORY CHIPS AND APPLICATION SYSTEM THEREOF

CROSS-REFERENCE TO RELATED APPLICATION

This application claims the priority benefit of Taiwan application serial no. 90122429, filed Sep. 11, 2001.

BACKGROUND OF THE INVENTION

1. Field of the Invention

The invention relates in general to an address converter apparatus for a memory chip, and more particularly, to an address converter apparatus and method for obtaining a memory controller application system that supports multiple memory chips.

2. Description of the Related Art

Due to the rapid development of memory chips, the controller application system that supports the old versions of memory chips has to be updated or replaced as the memory chips are upgraded. Similarly, the controller application system that supports the current versions of memory chips will face the same problem very soon. Therefore, the life cycle of the application system for memory chips is hard to estimate, and that causes inconvenience to the user. In addition, since the partition method of the current controller application system that supports the malfunctioning memory chip is limited, the damaged region cannot be isolated with a bank address partition method. The performance of the application system for isolating the damaged region of the memory chip is poor, and a lot of problems are caused.

SUMMARY OF THE INVENTION

The invention provides an address converter apparatus and method to support various kinds of memory chips to allow the controller application system that supports the old version of memory chip to also support the current version of memory chip, so that the life cycle of the controller application system is prolonged. Similarly, the controller application system that supports the current version of memory chip can support future versions of memory chips by using the apparatus and method provided by the present invention. In addition, the apparatus provided by the present invention can use different malfunctioning memory chip partition methods to resolve the poor efficiency problem of the current application system.

The invention provides an application system of an address converter apparatus to support various memory chips. The application system comprises a control chip, an addressing converter and a currently operating memory chip. The control chip outputs an address and chip select signal to control a first type memory chip. The current applied memory chip is one of either the first type memory chip, a second type memory chip, or a partly damaged first type memory chip. The addressing converter is coupled to the control chip and the currently operating memory chip to convert the address and chip select signal output by the control into an output address and chip select signal to control the currently operating memory chip.

The address converter apparatus that supports various memory chips comprises a select configuration and storage apparatus to configure and store a select configuration value of the currently operating memory chip, and a logic control and switch circuit. The logic control and switch circuit is coupled to the select configuration and storage apparatus, the control chip, and the currently operating memory chip to receive the address and chip select signal output by the control chip. According to the select configuration value, the address and chip select signal output by the control chip are converted into an output address and chip select signal by the logic control and switch circuit.

In the above decode converting apparatus that supports various memory chips, the logic control and switch circuit comprises a pass-through circuit, a chip partition circuit, a bank partition circuit for malfunctioning chip, a bank merge circuit and a switch circuit. The pass-through circuit is coupled to the control chip to directly conduct the address and chip select signal to the output address and chip select signal. The chip partition circuit is coupled to the control chip to partition and simulate the second memory chip into a plurality of the first type memory chips. The bank partition circuit for malfunctioning chip is coupled to the control chip to isolate the malfunctioning portion of the malfunctioning first type memory chips by bank partition, so as to obtain a half set of original memory chips. The bank merge circuit is coupled to the control chip to merge and simulate the isolated malfunctioning portions of the malfunctioning first type chips into a complete first type memory chip. The switch circuit is coupled to the pass-through circuit, the chip partition circuit, the bank partition circuit for malfunctioning chip, and the bank merge circuit, the select configuration and storage apparatus and the currently operating memory chip to select and output a correct output address and chip select signal among the pass-through circuit, the chip partition circuit, the bank partition circuit for malfunctioning chip, and the bank merge circuit to control the current operating circuit.

In a preferred embodiment of the present invention, the logic control and switch circuit further comprises a malfunctioning chip partition circuit coupled to the control chip and the switch circuit to partition the partly malfunctioning first type memory chip and to isolate the malfunctioning portion thereof. A memory chip with the same number of banks, and only a half capacity is obtained.

In the preferred embodiment of the present invention, the logic control and switch circuit further comprises a chip merge circuit coupled to the control chip and the switch circuit to merge and simulate the isolated partly malfunctioning first type memory chips into a complete first type memory chip in a row addressing manner.

In the preferred embodiment of the present invention, the logic control and switch circuit further comprises a bank address partition circuit coupled to the control chip and the switch circuit to partition and simulate the isolated partly malfunctioning first type memory chips into a memory chip with the complete bank number but half of the capacity.

In the preferred embodiment of the present invention, the logic control and switch circuit further comprises an inverse circuit coupled to the control chip and the switch circuit to invert the row address signal into an output row address signal.

The invention further comprises a converting method to support multiple kinds of memory chips to convert the address and chip select signal output by the control chip into an output address and chip select signal to control the currently operating memory chip. The currently operating memory chip includes one of either a first type memory chip, a second type memory chip, or a plurality of partly malfunctioning first type memory chips. The converting method includes selecting and storing a select configuration value of the currently operating memory chip, receiving the output address and chip select signal, and converting the output address and chip select signal into an output address and chip select signal to control the currently operating memory chip.

In the converting method to support multiple kinds of memory chips, when the currently operating memory chip is the first type memory chip, the address and chip select signal is directly conducted to the output address and chip select signal. When the currently operating memory chip is the second type memory chip, the second type memory chip is partitioned and simulated as a plurality of first type memory chips. When the currently operating memory chip is the partly malfunctioning first type memory chip, the malfunctioning portions thereof are partitioned by bank partition. The isolated malfunctioning first type memory chips are then merged and simulated into a complete first type memory chip.

It is known from the above that the invention uses a flexibly programmed memory addressing circuit as a bridge between the control chip and the memory chip. According to the select configuration value, a correct addressing method is selected to convert the address and chip select signal from the control chip into the output address and chip select signal, so as to control the currently operating memory chip. The old memory chip previously supported can be replaced with a new memory chip with multiple capacities, and the original application system can be used continuously. The lifetime of the application system is prolonged. In addition, by different malfunctioning chip partition and isolation methods, the system reliability is enhanced and the performance is improved.

Both the foregoing general description and the following detailed description are exemplary and explanatory only and are not restrictive of the invention, as claimed.

DESCRIPTION OF THE PREFERRED EMBODIMENTS

Figure 1:
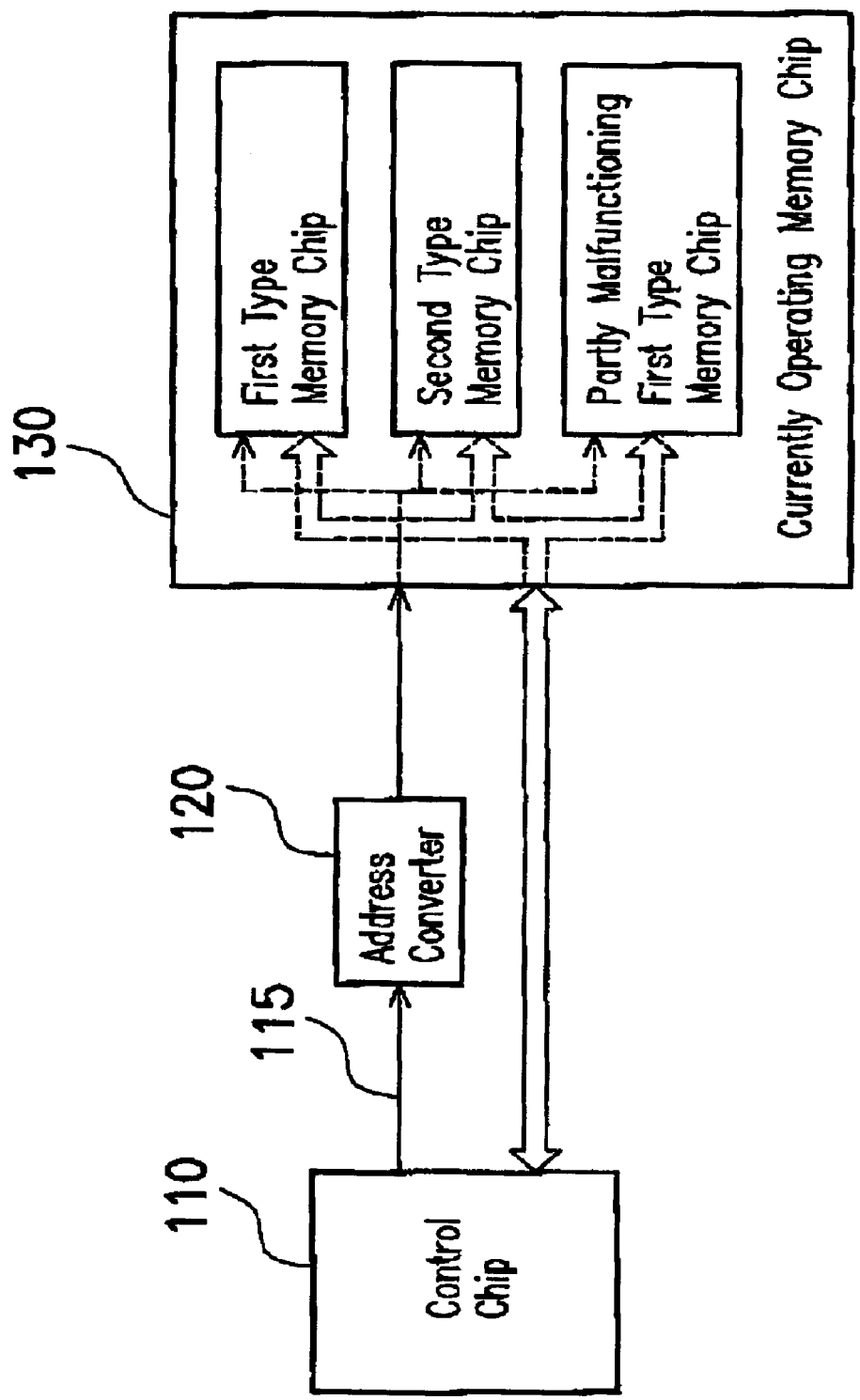
FIG. 1 shows an address converter apparatus that supports various kinds of memory chips and an application system thereof.

FIG. 1 shows an embodiment of an address converter apparatus that supports various kinds of memory chips and the application system thereof according to the present invention. As shown in FIG. 1, the address converter apparatus comprises a control chip 110, an addressing converter 120 and a currently operating memory chip 130. The control chip 110 outputs an address and chip select signal 115 to control a first type memory chip. The first type memory chip is the memory chip that the control chip 110 supports. The currently operating memory chip 130 is one of either the first type memory chip, a second type memory chip, or a partly malfunctioning first type memory chip. The control chip 110 cannot directly support the second type memory chip. The addressing converter 120 is coupled to the control chip and the currently operating memory chip 130 to convert the address and chip select signal 115 output by the control chip 110 into an output address and chip select signal to control the currently operating memory chip 130.

Figure 2:
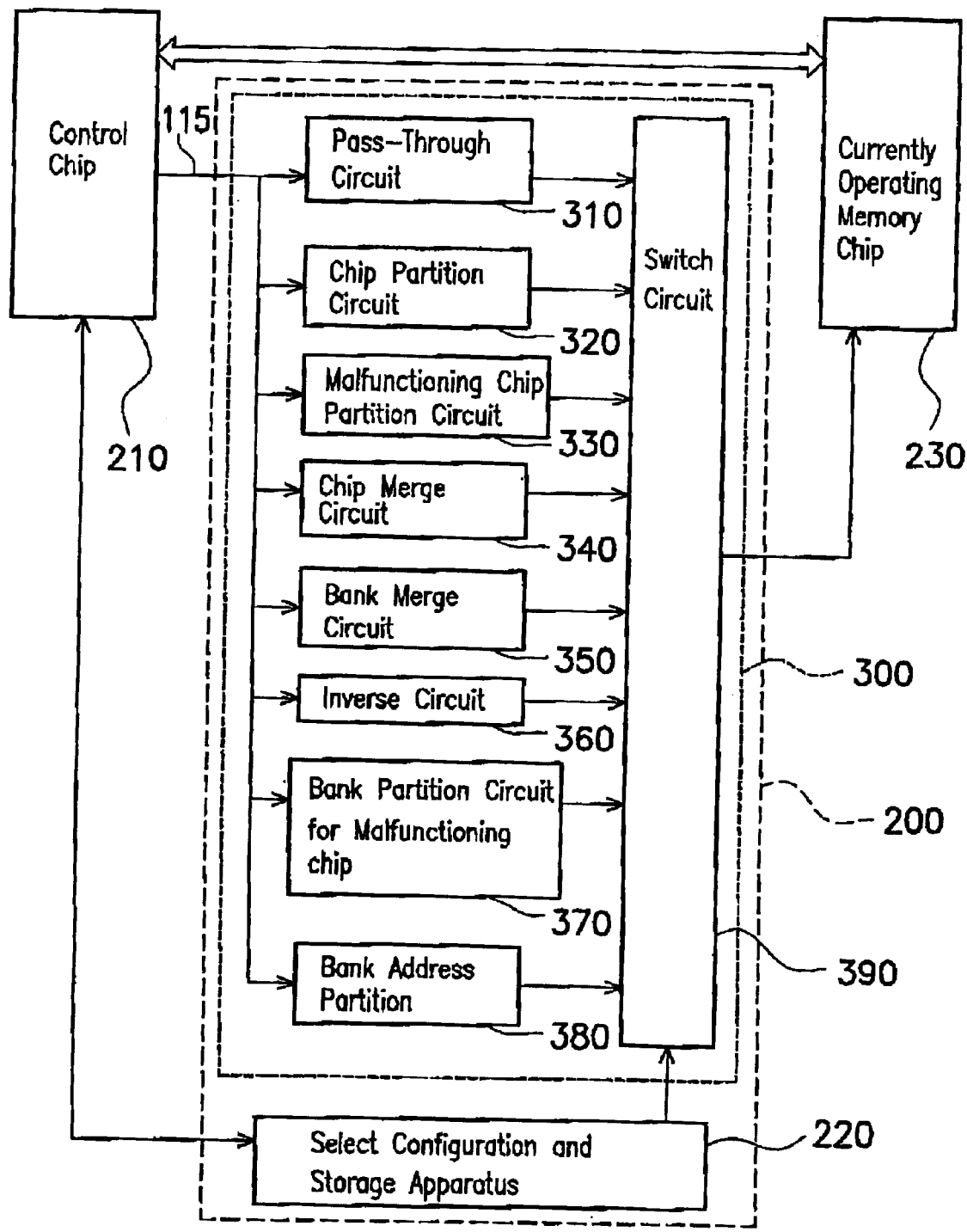
FIG. 2 shows a block diagram of an address converter apparatus that supports various kinds of memory chips and an application system thereof.

In FIG. 2, a block diagram of the address converter apparatus that supports multiple kinds of memory chips and the application system thereof is shown. As shown in FIG. 2, the address converter apparatus 200 includes a select configuration and storage apparatus 220 and a logic control and switch circuit 300. The select configuration and storage apparatus 220 is used to configure and store a select configuration value of the currently operating memory chip 230. Such apparatus may be selected from an electrically erasable and programmable read only memory (EEPROM). The logic control and switch circuit 300 is coupled to the select configuration and storage apparatus 220, the control chip 210 and the currently operating memory chip 230 to receive the address and chip select signal 115 output by the control chip 210. The address and chip select signal 115 is then converted into an output address and chip select signal to control the currently operating memory chip 230. The address and chip select signal 115, by a bus signal form, includes a first bank signal, a second bank signal, a column address signal, a row address signal, a first chip select signal and a second chip select signal. The output address and chip select signal, by a bus signal form, includes an output bank address signal, an output column address signal, an output row address signal, a first output chip select signal and a second output chip select signal.

In one preferred embodiment of the invention, the logic control and switch circuit 300 comprises a pass-through circuit 310, a chip partition circuit 320, a bank partition circuit for malfunctioning chip 370, a bank merge circuit 350 and a switch circuit 390. The pass-through circuit 310 is coupled to the control chip 210 and the switch circuit 390 to directly conduct the address and chip select signal to the output address and chip select signal. The chip partition circuit 320 is coupled to the control chip 210 to partition and simulate the second type memory chip into a plurality of first type memory chips. When the first chip select signal or the second chip select signal is enabled, the first output chip select signal is enabled. When the first chip select signal is enabled and the second chip select signal is disabled, the highest bit of the output row address signal is at a low level (Low). When the first chip select signal is disabled and the second chip select signal is enabled, the highest bit of the output row address signal is at a high level (High). The bank partition circuit for malfunctioning chip 370 is coupled to the control chip 210 and the switch circuit 370 to partition and isolate the malfunctioning portion of the partly malfunctioning first type memory with a bank partition method, so as to obtain a memory chip with one half of the bank number. The method includes fixing the highest bit of the output bank address signal to High, so as to partition and select to use the normal operating high numbered bank, or fixing the highest bit of the output bank address signal to Low, so as to partition and select to use the normal operating low numbered bank. The bank merge circuit 350 is coupled to the control chip 210 and the switch circuit 390 to merge and simulate the bank partitioned and isolated partly malfunctioning first type memory chips into a complete first type memory chip. When the first chip select signal is enabled and the first bank address signal and the second bank address signal are both Low, the first output chip select signal is enabled and the output bank address signal is Low. When the first chip select signal is enabled, the first bank address signal is Low, and the second bank address signal is High, the first output chip select signal is enabled and the output bank address is High. When the first chip select signal is enabled, the first bank address signal is High, and the second bank address is Low, the second output chip select signal is enabled and the output bank address signal is Low. When the first chip select signal is enabled, the first bank address signal is High and the second bank address signal is High, the second output chip select signal is enabled and the output bank address signal is High. The switch circuit 390 is coupled to the pass-through circuit 310, the chip partition circuit 320, the bank partition circuit for malfunctioning chips 370, the bank merge circuit 350, the select configuration and storage apparatus 220 and the currently operating memory chip 230. According to the select configuration value of the select configuration and storage apparatus 220, the switch circuit 390 selects a correct output address and chip select signal among the outputs of the pass-through circuit 310, the chip partition circuit 320, the bank partition circuit for malfunctioning chip 370, and the bank merge circuit 350, so as to control the currently operating memory chip 230.

To provide more partition and isolation methods for the partly malfunctioning first type memory chips in the preferred embodiment of the present invention, the logic control and switch circuit 300 further comprises a malfunctioning chip partition circuit 330, a chip merge circuit 340, a bank address partition circuit 380 and an inverse circuit 360. The malfunctioning chip partition circuit 330 is coupled to the control chip 210 to partition and isolate the malfunctioning portion of the partly malfunctioning first type memory chip. The memory chip with same number of banks and half capacity is thus obtained. The highest bit of the output row address signal is fixed at High or Low to partition and select using the lower or upper portion that operates normally, respectively. The chip merge circuit 340 is coupled to the control chip 210 to merge the partitioned and isolated partly malfunctioning first type memory chips into a complete first type memory chip. When the first chip select signal is enabled, and the highest bit of the row address signal is Low, the first output chip select signal is enabled. When the first chip select signal is enabled, and the highest bit of the row address signal is High, the second output chip select signal is enabled. The bank address partition circuit 380 is coupled to the control chip 210 and the switch circuit 390 to further bank partition and simulate the bank partitioned and isolated partly malfunctioning first type memory chip as a memory chip with a complete bank number and half capacity. When the first bank address signal and the second bank address signal are both Low, the output bank address signal is Low, and the highest bit of the output row address signal is Low. When the first bank address signal is Low and the second bank address signal is High, the output bank address signal is Low and the highest bit of the output row address signal is High. When the first bank address signal is High and the second bank address signal is Low, the output bank address signal is High and the highest bit of the output row address signal is Low. When the first bank address signal is High and the second bank address signal is High, the output bank address signal is High and the highest bit of the output row address signal is High. The inverse circuit 360 is coupled to the control chip 210 and the switch circuit 390 to invert the row address signal into the output row address signal.

In summary, the preferred embodiment of the present invention provides a converting method that supports multiple kinds of memory chips. The address and chip select signal output from the control chip is converted as an output address and chip select signal to control the currently operating memory chip. The currently operating memory chip comprises one of either the first type memory chip, the second type memory chip, or a partly malfunctioning first type memory chip. The select configuration of the currently operating chip is selected, configured and stored. The address and chip select signal output from the control chip is then received. According to the select configuration value, the address and chip select signal is converted into an output address and chip select signal to control the currently operating memory chip. The address and chip select signal includes a first bank address signal, a second bank address signal, a column address signal, a row address signal, a first chip select signal and a second chip select signal. The output address and chip select signal includes an output bank address signal, an output column address signal, an output row address signal, a first output chip select signal and a second output chip select signal.

In one embodiment of the converting method that supports various kinds of memory chips, when the currently operating memory chip is the first type memory chip, the second step includes directly conducting the address and chip select signal to the output address and chip select signal. When the currently operating memory chip is the second type memory chip, the second step includes partitioning and simulating the second type memory chip into a plurality of first type memory chips. When the first chip select signal or the second chip select signal is enabled, the first output chip select signal is enabled. When the first chip select signal is enabled and the second chip select signal is disabled, the highest bit of the output row address signal is Low. When the first chip select signal is disabled and the second chip select signal is enabled, the highest bit of the output row address signal is High. When the currently operating memory chip includes a plurality of partly malfunctioning first type memory chips, the second step includes bank partitioning and isolating malfunctioning portions of the partly malfunctioning first type memory chip. A memory chip with the original bank number and half of the original capacity is obtained. The bank partitioned and isolated malfunctioning portions of the partly malfunctioning first type memory chips are then merged and simulated into a complete first type memory chip. The method includes configuring the highest bit of the output bank address signal to High to partition and select the unused normal high numbered banks. Alternatively, the highest bit of the output bank address signal is configured to Low to partition and select the normal low numbered banks. When the first chip select signal is enabled, and the first and second bank address signals are Low, the first output chip select signal is enabled and the output bank address signal is Low. When the first chip select signal is enabled, the first bank address signal is Low and the second bank address signal is High, the first output chip select signal is enabled, and the output bank address signal is High. When the first chip select signal is enabled, the first bank address signal is High, and the second bank address signal is Low, the second output chip select signal is enabled, and the output bank address signal is Low. When the first chip select signal is enabled, the first bank address signal is High, and the second bank address signal is High, the second output chip select signal is enabled, and the output bank address signal is High.

According to the above disclosure, the present invention provides address converter apparatus and method used in an application system to support various kinds of memory chips, so that the application system is able to use the memory chips supported by the control chip, but also able to use new memory chips with multiple capacities. The invention further selects the optimal method to partition and isolate the malfunctioning portion of the partly malfunctioning memory chip, which are then merged again for use to improve the system performance.

Other embodiments of the invention will appear to those skilled in the art from consideration of the specification and practice of the invention disclosed herein. It is intended that the specification and examples to be considered as exemplary only, with a true scope and spirit of the invention being indicated by the following claims.

What is claimed is:

1. An application system with an address converter apparatus to support various kinds of memory chips, comprising:

a control chip, outputting an address and chip select signal to control a first type memory chip, wherein the control chip does not directly support and control a second type memory chip;

a currently operating memory chip, including one of the first type memory chip, the second type memory chip, or a partly malfunctioning first type memory chip; and the address converter apparatus, coupled to the control chip and the currently operating memory chip to convert the address and chip select signal output by the control chip into an output address and chip select signal to control the currently operating memory chip, wherein the address converter apparatus comprises:

a select configuration and storage apparatus, to configure and store a select configuration value of the currently operating memory chip; and a logic control and switch circuit, coupled to the select configuration and storage apparatus, the control chip and the currently operating memory chip, to receive the address and chip select signal, and to convert the address and chip select signal into the output address and chip select signal to control the currently operating memory chip, wherein the address and chip select signal includes a first bank address signal, a second bank address signal, a column address signal, a row address signal, a first chip select signal, and a second chip select signal, and wherein the output address and chip select signal includes an output bank address signal, an output column address signal, an output row address signal, a first output chip select signal, and a second output chip select signal.

2. The application system according to claim 1, wherein the logic control and switch circuit further comprises:

a pass-through circuit, coupled to the control chip to directly conduct the address and chip select signal to the output address and chip select signal;

a chip partition circuit, coupled to the control chip to partition and simulate the second type memory chip into a plurality of first type memory chips, wherein when one of the first chip select signal and the second chip select signal is enabled, the first output chip select signal is enabled, when the first chip select signal is enabled and the second chip select signal is disabled, a highest bit of the output row address signal is at a low level, and when the first chip select signal is disabled and the second chip select signal is enabled, a highest bit of the output row address signal is at a high level;

a bank partition circuit for malfunctioning chip, coupled to the control chip to bank partition and isolate a malfunctioning portion of the partly malfunctioning first type memory chip, wherein a highest bit of the output bank address is at either high or low level;

a bank merge circuit, coupled to the control chip to merge and simulate a plurality of bank partitioned and isolated malfunctioning portions into a complete first type memory chip, wherein when the first chip select signal is enabled, the first bank address signal and the second bank address signal are both at a low level, the first output chip select signal is enabled and the output bank address signal is at a low level, when the first chip select signal is enabled, the first bank address signal is at a low level and the second bank address signal is at a high level, the first output chip select signal is enabled and the output bank address signal is at a high level, when the first chip select signal is enabled, the first bank address signal is at a high level and the second bank address signal is at a low level, the second output chip select signal is enabled and the output bank address signal is at a low level, and when the first chip select signal is enabled, the first bank address signal is at a high level and the second bank address signal is at a high level, the second output chip select signal is enabled, and the output bank address signal is at a high level; and a switch circuit, coupled to the pass-through circuit, the chip partition circuit, the bank partition circuit for malfunctioning chip, the bank merge circuit, the select configuration and storage apparatus and the currently operating memory chip, to select a correct output address and chip select signal from outputs of the pass-through circuit, the chip partition circuit, the bank partition circuit for malfunctioning chip, the bank merge circuit and the select configuration and storage apparatus to control the currently operating memory chip.

3. The application system according to claim 2, wherein the logic control and switch circuit further comprises a malfunctioning chip partition circuit coupled to the control chip and the switch circuit to partition and isolate the malfunctioning portion of the partly malfunctioning first type memory chip, wherein a highest bit of the output row address signal is fixed at either a low or a high level.

4. The application system according to claim 2, wherein the logic control and switch circuit further comprises a chip merge circuit coupled to the control chip and the switch circuit to merge and simulate a plurality of partitioned and isolated partly malfunctioning first type memory chips into a complete first type memory chip, wherein when the first chip select signal is enabled, and the highest bit of the row address signal is at a low level, the first output chip select signal is enabled, and when the first chip select signal is enabled, and the highest bit of the row address signal is at a high level, the second output chip select signal is enabled.

5. The application system according to claim 2, wherein the logic control and switch circuit further comprises a bank partition circuit coupled to the control chip and the switch circuit to further bank partition and isolate the partitioned and isolated partly malfunctioning first type memory chip into a memory chip with a complete bank, wherein when the first and the second bank address signals are both at a low level, the output bank address signal is at a low level and the highest bit of the output row address signal is at a low level, when the first and second bank address signals are at a high level, the output bank address signal is at a low level and the highest bit of the output row address signal is at a high level, when the first bank address signal is at a high level and the second bank address signal is at a low level, the output bank address signal is at a high level and the highest bit of the row address signal is at a low level, and when the first and second bank address signals are at a high level, the output bank address signal is at a high level, and the highest bit of the output row address signal is at a high level.

6. The application system according to claim 2, wherein the logic control and switch circuit further comprises an inverse circuit coupled to the control chip and the switch circuit to invert the address and chip select signal into an output address and chip select signal.

7. The application system according to claim 2, wherein the select configuration and storage apparatus comprises an electrically erasable and programmable read only memory.

8. An address converter apparatus to support various kinds of memory chips, to convert an address and chip select signal output from a control chip into an output address and chip select signal to control a currently operating memory chip, wherein the currently operating memory chip includes one of a first type memory chip, a second type memory chip, or a partly malfunctioning first type memory chip, and the control chip does not directly support and control the second type memory chip, the address converter apparatus comprising:

a select configuration and storage apparatus, to configure and store a select configuration value of the currently operating memory chip; and a logic control and switch circuit, coupled to the select configuration and storage apparatus, the control chip and the currently operating memory chip, to receive the address and chip select signal, and to convert the address and chip select signal into the output address and chip select signal to control the currently operating memory chip, wherein the address and chip select signal includes a first bank address signal, a second bank address signal, a column address signal, a row address signal, a first chip select signal, and a second chip select signal, and wherein the output address and chip select signal includes an output bank address signal, an output column address signal, an output row address signal, a first output chip select signal, and a second output chip select signal.

9. The application system according to claim 8, wherein the logic control and switch circuit further comprises:

a pass-through circuit, coupled to the control chip to directly conduct the address and chip select signal to the output address and chip select signal;

a chip partition circuit, coupled to the control chip to partition and simulate the second type memory chip into a plurality of first type memory chips, wherein when one of the first chip select signal and the second chip select signal is enabled, the first output chip select signal is enabled, when the first chip select signal is enabled and the second chip select signal is disabled, a highest bit of the output row address signal is at a low level, and when the first chip select signal is disabled and the second chip select signal id enabled, a highest bit of the output row address signal is at a high level;

a bank partition circuit for malfunctioning chip, coupled to the control chip to bank partition and isolate a malfunctioning portion of the partly malfunctioning first type memory chip, wherein a highest bit of the output bank address is at either high or low level;

a bank merge circuit, coupled to the control chip to merge and simulate a plurality of bank partitioned and isolated malfunctioning portions into a complete first type memory chip, wherein when the first chip select signal is enabled, the first bank address signal and the second bank address signal are both at a low level, the first output chip select signal is enabled and the output bank address signal is at a low level, when the first chip select signal is enabled, the first bank address signal is at a low level and the second bank address signal is at a high level, the first output chip select signal is enabled and the output bank address signal is at a high level, when the first chip select signal is enabled, the first bank address signal is at a high level and the second bank address signal is at a low level, the second output chip select signal is enabled and the output bank address signal is at a low level, and when the first chip select signal is enabled, the first bank address signal is at a high level and the second bank address signal is at a high level, the second output chip select signal is enabled, and the output bank address signal is at a high level; and a switch circuit, coupled to the pass-through circuit, the chip partition circuit, the bank partition circuit for malfunctioning chip, the bank merge circuit, the select configuration and storage apparatus and the currently operating chip, to select a correct output address and chip select signal from outputs of the pass-through circuit, the chip partition circuit, the bank partition circuit for malfunctioning chip, the bank merge circuit and the select configuration and storage apparatus to control the currently operating memory chip.

10. The application system according to claim 9, wherein the logic control and switch circuit further comprises a malfunctioning chip partition circuit coupled to the control chip and the switch circuit to partition and isolate the malfunctioning portion of the partly malfunctioning first type memory chip, wherein a highest bit of the output row address signal is fixed at either a low or a high level.

11. The application system according to claim 9, wherein the logic control and switch circuit further comprises a chip merge circuit coupled to the control chip and the switch circuit to merge and simulate a plurality of partitioned and isolated partly malfunctioning first type memory chips into a complete first type memory chip, wherein when the first chip select signal is enabled, and the highest bit of the row address signal is at a low level, the first output chip select signal is enabled, and when the first chip select signal is enabled, and the highest bit of the row address signal is at a high level, the second output chip select signal is enabled.

12. The application system according to claim 9, wherein the logic control and switch circuit further comprises a bank partition circuit coupled to the control chip and the switch circuit to further bank partition and isolate the partitioned and isolated partly malfunctioning first type memory chip into a memory chip with a complete bank, wherein when the first and the second bank address signals are both at a low level, the output bank address signal is at a low level and the highest bit of the output row address signal is at a low level, when the first and second bank address signals are at a high level, the output bank address signal is at a low level and the highest bit of the output row address signal is at a high level, when the first bank address signal is at a high level and the second bank address signal is at a low level, the output bank address signal is at a high level and the highest bit of the row address signal is at a low level, and when the first and second bank address signals are at a high level, the output bank address signal is at a high level, and the highest bit of the output row address signal is at a high level.

13. The application system according to claim 9, wherein the logic control and switch circuit further comprises an inverse circuit coupled to the control chip and the switch circuit to invert the address and chip select signal into an output address and chip select signal.

14. The application system according to claim 9, wherein the select configuration and storage apparatus comprises an electrically erasable and programmable read only memory.

15. An address converter method to support various kinds of memory chips, to convert an address and chip select signal output from a control chip into an output address and chip select signal to control a currently operating memory chip, wherein the currently operating memory chip includes one of a first type memory chip, a second type memory chip, or a partly malfunctioning first type memory chip, and the control chip does not directly support and control the second type memory chip, the address converter method comprising:

a first step, to select configuration and store a select configuration value of the currently operating memory chip; and a second step, to receive the address and chip select signal output from the control chip, and to convert the address and chip select signal into an output address and chip select signal according to the select configuration value, so as to control the currently operating memory chip, wherein the address and chip select signal includes a first bank address signal, a second bank address signal, a column address signal, a row address signal, a first chip select signal, and a second chip select signal, and the output address and chip select signal includes an output bank address signal, an output column address signal, an output row address signal, a first output chip select signal, and a second output chip select signal.

16. The method according to claim 15, wherein when the current operating memory chip includes the first type memory chip, the second step includes directly conducting the address and chip select signal into the output address and chip select signal.

17. The method according to claim 15, wherein when the current operating memory chip includes the second type memory chip, the second step includes partitioning and simulating the second type memory chip into a plurality of first type memory chips, and when one of the first and second chip select signals is enabled, the first output chip select signal is enabled, when the first chip select signal is enabled and the second chip select signal is disabled, a highest bit of the output row address signal is at a low level, and when the first chip select signal is disabled and the second chip select signal is enabled, the highest bit of the output row address signal is at a high level.

18. The method according to claim 15, wherein when the currently operating memory chip includes the partly malfunctioning first type memory chip, the second step includes partitioning and isolating a malfunctioning portion of the partly malfunctioning first type memory chip, and further bank partitioning and simulating a plurality of partitioned and isolated malfunctioning portions of the partly malfunctioning first type memory chip into a complete first type memory chip, wherein a highest bit of the output bank address is fixed at either high or low level, and when the first chip select signal is enabled, and the first and second bank address signals are both at a low level, the first output chip select address signal is enabled and the output bank address signal is at a low level, when the first chip select signal is enabled, the first bank address signal is at a low level and second bank address signals is at a high level, the first output chip select signal is enabled and the output bank address signal is at a high level, when the first chip select signal is enabled, the first bank address signal is at a high level and the second bank address signal is at a low level, the second output chip select signal is enabled and the output bank address signal is at a high level.

* * * * *